(12) United States Patent
Shibata

(10) Patent No.: US 7,230,282 B2
(45) Date of Patent: Jun. 12, 2007

(54) III-V GROUP NITRIDE SYSTEM SEMICONDUCTOR SELF-STANDING SUBSTRATE, METHOD OF MAKING THE SAME AND III-V GROUP NITRIDE SYSTEM SEMICONDUCTOR WAFER

(75) Inventor: Masatomo Shibata, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 11/052,764

(22) Filed: Feb. 9, 2005

(65) Prior Publication Data

US 2006/0033119 A1 Feb. 16, 2006

(30) Foreign Application Priority Data

Aug. 10, 2004 (JP) .............................. 2004-233701

(51) Int. Cl.
*H01L 33/00* (2006.01)
(52) U.S. Cl. ...................... 257/103; 257/190; 257/189; 257/200; 257/201; 257/614
(58) Field of Classification Search ................ 257/190, 257/103; 438/22, 48
See application file for complete search history.

(56) References Cited

U.S. PATENT DOCUMENTS

| | | | |
|---|---|---|---|
| 6,667,184 B2 | 12/2003 | Motoki et al. | |
| 2002/0048964 A1* | 4/2002 | Yuasa et al. | 438/763 |
| 2002/0197825 A1 | 12/2002 | Usui et al. | |
| 2003/0045017 A1* | 3/2003 | Hiramatsu et al. | 438/46 |
| 2003/0197166 A1* | 10/2003 | Ishida et al. | 257/1 |
| 2004/0206967 A1* | 10/2004 | Oshima et al. | 257/85 |
| 2004/0245535 A1* | 12/2004 | D'Evelyn et al. | 257/94 |

FOREIGN PATENT DOCUMENTS

| | | |
|---|---|---|
| JP | 11-251253 | 9/1999 |
| JP | 2003-165799 | 6/2003 |
| JP | 2003-178984 | 6/2003 |

OTHER PUBLICATIONS

Ok-Hyun Nam, et al., "Lateral epitaxy of low defect density GaN layers via organometallic vapor phase epitaxy", Appl. Phys. Lett. 71, vol. 18, Nov. 3, 1997, pp. 2638-2640.
Akira Usui, et al., "Thick GaN Epitaxial Growth with Low Dislocation Density by Hydride Vapor Phase Epitaxy", Japan Journal Appl. Phys. vol. 36, Part 2, No. 7B, Jul. 15, 1997, pp. L899-L902.
Kensaku Motoki, et al, "Preparation of Large Freestanding GaN Substrates by Hydride Vapor Phase Epitaxy Using GaAs as a Starting Substrate", Japan Journal Appl. Phys. vol. 40, Part 2, No. 2B, Feb. 15, 2001, pp. L140-L143.

* cited by examiner

*Primary Examiner*—Evan Pert
*Assistant Examiner*—Tan Tran
(74) *Attorney, Agent, or Firm*—McGinn IP Law Group, PLLC

(57) ABSTRACT

A III–V group nitride system semiconductor self-standing substrate has: a first III–V group nitride system semiconductor crystal layer that has a region with dislocation lines gathered densely, the dislocation lines being gathered substantially perpendicular to a surface of the substrate, and a region with dislocation lines gathered thinly; and a second III–V group nitride system semiconductor crystal layer that is formed up to 10 μm from the surface of the substrate on the first III–V group nitride system semiconductor crystal layer and that has a dislocation density distribution that is substantially uniform.

1 Claim, 9 Drawing Sheets

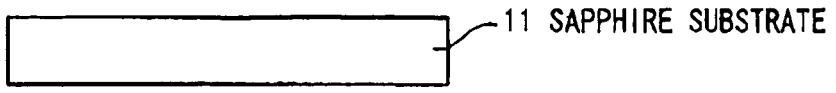
FIG. 4A — 11 SAPPHIRE SUBSTRATE
FIG. 4B — 12 GaN CRYSTAL, 11
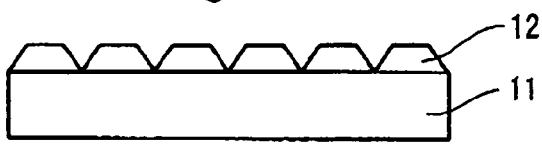
FIG. 4C — 12, 11
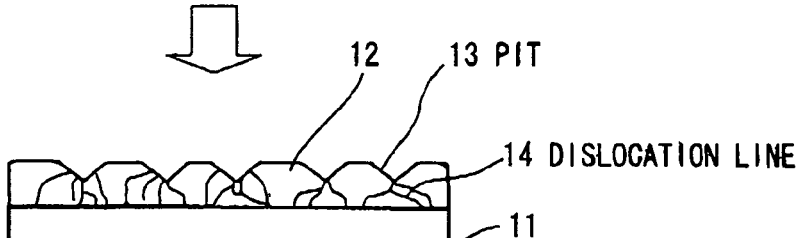
FIG. 4D — 12, 13 PIT, 14 DISLOCATION LINE, 11
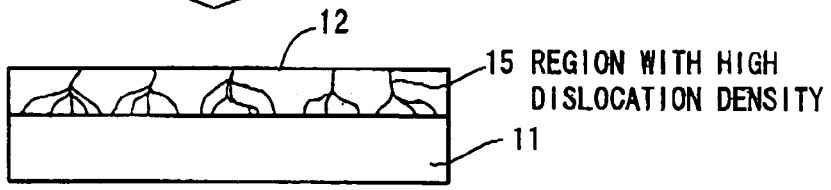
FIG. 4E — 12, 15 REGION WITH HIGH DISLOCATION DENSITY, 11
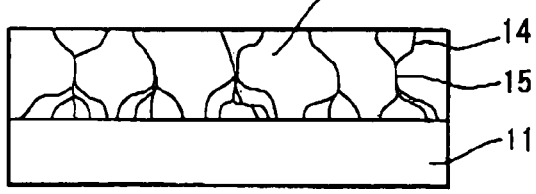
FIG. 4F — 12, 14, 15, 11
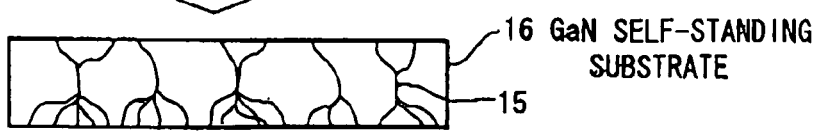
FIG. 4G — 16 GaN SELF-STANDING SUBSTRATE, 15

- 15 REGION WITH HIGH DISLOCATION DENSITY
- 16 GaN SELF-STANDING SUBSTRATE
- 14 DISLOCATION LINE
- LAYER F
- LAYER E
- LAYER D
- LAYER C

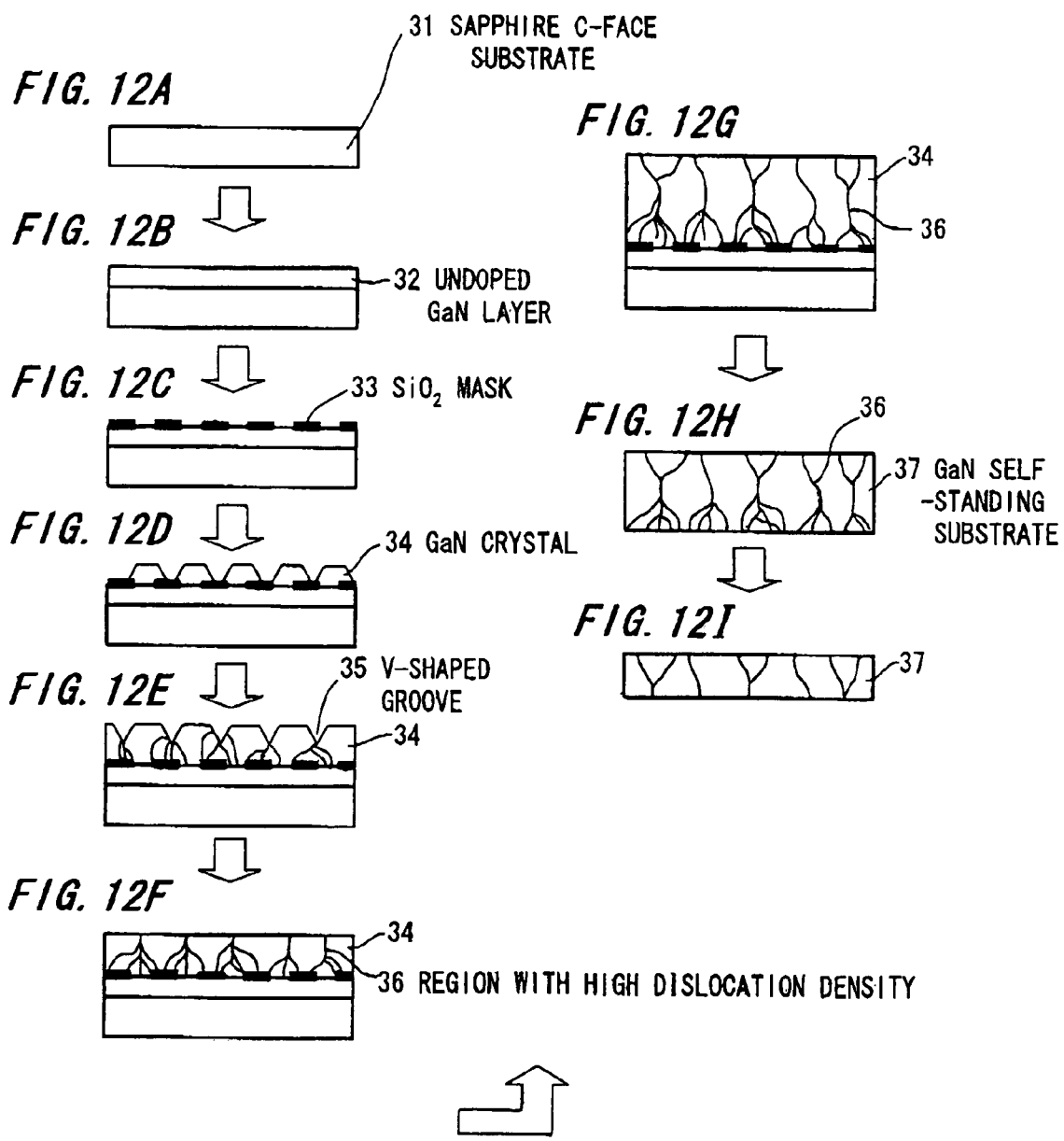

III-V GROUP NITRIDE SYSTEM SEMICONDUCTOR SELF-STANDING SUBSTRATE, METHOD OF MAKING THE SAME AND III-V GROUP NITRIDE SYSTEM SEMICONDUCTOR WAFER

The present application is based on Japanese patent application No. 2004-233701, the entire contents of which are incorporated herein by reference.

BACKGROUND OF THE INVENTION

1. Field of the Invention

The present invention relates to a III–V group nitride system semiconductor self-standing substrate and, in particular, to a III–V group nitride system semiconductor self-standing substrate with a uniform dislocation density distribution and a reduced dislocation on its surface, a method of making the same, and a III–V group nitride system semiconductor wafer with a nitride system semiconductor layer epitaxially grown on the substrate.

2. Description of the Related Art

Nitride system semiconductor materials such as gallium nitride (GaN), indium gallium nitride (InGaN) and gallium aluminum nitride (GaAlN) have a sufficiently wide bandgap and are of direct transition type in inter-band transition. Therefore, they are a great deal researched to be used for short-wavelength light emitting devices. Further, they have a high saturation drift velocity of electron and can use two-dimensional carrier gases in hetero junction. Therefore, they are also expected to be used for electronic devices.

Nitride semiconductor layers to compose the device are epitaxially grown on an underlying substrate by using a vapor-phase growth process such as MOVPE (metal organic vapor phase epitaxy), MBE (molecular beam epitaxy) and HVPE (hydride vapor phase epitaxy). However, since there is no underlying substrate that has a lattice constant matched to that of nitride semiconductor layers, it is impossible to obtain a high quality of grown layer and therefore a number of crystal defects (dislocations) are generated in the resulting nitride semiconductor layers. Since the crystal defects interfere with enhancement in device properties, researches to reduce the crystal defect in nitride semiconductor layers are a great deal conducted so far.

In order to obtain a III-group element nitride system crystal with relatively few crystal defects, a method is known that a low-temperature deposition buffer layer (buffer layer) is formed on a hetero-substrate such as sapphire and then an epitaxial layer is grown thereon. The crystal growth method using the buffer layer is conducted as follows. AlN or GaN is deposited on a sapphire substrate nearly at 500° C. to form an amorphous film or a continuous film including polycrystal. This film is heated to about 1000° C. and thereby part thereof is evaporated or crystallized to form crystal nuclei with a high density. Then, using the crystal nuclei as growth nuclei, a GaN film with a relatively good crystalline quality is grown. However, even when the method using the buffer layer is conducted, the resulting GaN film includes a considerable number of crystal defects such as a penetrating dislocation or a vacancy. Thus, it is not a satisfactory method for obtaining a high-performance device desired currently.

In order to solve the above problem, a method is great deal researched that a GaN substrate is used as a crystal growth substrate and semiconductor layers to compose a device section are grown thereon. Herein, a GaN substrate for crystal growth is called GaN self-standing substrate. A known method of making the GaN self-standing substrate is ELO (epitaxial lateral overgrowth; e.g., Appl. Phys. Lett. 71 (18) 2638 (1997)). The ELO is conducted such that a mask with openings is formed on an underlying substrate and a GaN layer with reduced dislocations is laterally grown through the openings. For example, Japanese patent application laid-open No. 11-251253 discloses a method of making a self-standing GaN substrate that a GaN layer is grown on a sapphire substrate by ELO and then the sapphire substrate is removed by etching.

Further, FIELO (facet-initiated epitaxial lateral overgrowth; e.g., A. Usui et al., Jpn. J. Appl. Phys. Vol. 36(1997), pp. L899–L902) is known that is a modification of ELO. The FIELO is in common with the ELO in that a mask of silicon dioxide is used for selective growth, and is different from the ELO in that a facet is formed at the mask opening in the selective growth. By forming the facet, the propagation direction of dislocation is varied so as to reduce the penetrating dislocation to reach the upper surface of epitaxial growth layer. Using the FIELO, a thick GaN layer is grown on an underlying substrate such as sapphire. Then the underlying substrate is removed. Thus, a GaN self-standing substrate with relatively few crystal defects can be obtained.

Still further, DEEP (dislocation elimination by the epi-growth with inverted-pyramidal pits: e.g., K. Motoki et al., Jpn. J. Appl. Phys. Vol. 40 (2001) pp. L140–L143, Japanese patent application laid-open No. 2003-165799) is known as a method for making a GaN self-standing substrate with few dislocations. The DEEP is conducted such that a mask of silicon nitride etc. patterned on a GaAs substrate is used in growing a GaN layer, where a plurality of pits are formed intentionally surrounded by facets on the surface of crystal to collect dislocations at the bottom region of pit, thereby reducing the number of dislocations at the other region.

In the abovementioned ELO and DEEP, the initial crystal growth is conducted while generating facets on the crystal growth interface. There is a property that the propagation direction of a dislocation propagating during the crystal growth is bent by the facet. Using the property, the dislocation density on the surface of substrate can be reduced while preventing the dislocation from reaching the upper surface of crystal. On the other hand, by generating the pit surrounded by facets at the crystal growth interface in crystal growth, dislocations are densely gathered at the bottom region of pit. Due to the collecting of dislocations, the dislocations can be eliminated while running into each other, or the penetration of dislocation toward the upper surface can be stopped while having a dislocation loop. Thereby, the dislocation density can be reduced effectively.

Furthermore, VAS (void-assisted separation: e.g., Japanese patent application laid-open No. 2003-178984) is known as a method for making a III group nitride system semiconductor substrate with few dislocations. The VAS is conducted such that a metal film is formed on an underlying substrate with a first III group nitride system semiconductor layer formed thereon or on an underlying substrate made of the first III group nitride system semiconductor, the underlying substrate is thermally treated in an atmosphere that contains hydrogen gas or hydrogen-contained compound gas to form voids in the first III group nitride system semiconductor layer, and then a second III group nitride system semiconductor layer is formed on the metal film.

Although a GaN substrate is obtained by growing a GaN layer by HVPE on a hetero-substrate based on ELO, DEEP etc. and then separating the GaN layer from the underlying substrate, such a GaN substrate has generally in its as-grown state a morphology that pits or hillocks are generated on the upper surface and its back side surface also has a rough surface like a frosted glass. Since it is difficult to grow there on an epitaxial layer for device fabrication if nothing is done, the upper and lower surfaces of the substrate are generally mirror-finished by polishing to use it for device fabrication.

In conventional semiconductor substrates such as Si and GaAs, there cannot occur a problem that dislocation density or its distribution is significantly dispersed on the upper and lower surfaces since the substrates can be made by using a method of cutting away a substrate from its crystal ingot.

However, in the case of GaN self-standing substrate, since thick GaN crystal epitaxially grown on a hetero-substrate is separated (peeled) from the hetero-substrate after the growth to obtain the GaN self-standing substrate, it is difficult to suppress the occurrence of dislocation near at the hetero-epitaxial growth interface corresponding to the initial stage of crystal growth. Therefore, the dislocations densely gathered need to be reduced during the growth of thick epi-crystal film to be used as the self-standing substrate so as to finally have a substrate surface with reduced dislocations. Accordingly, the abovementioned dislocation-reducing methods such as ELO, FIELO and DEEP are developed.

However, the distribution of dislocation density is highly dispersed on the substrate surface although the dislocation density can be reduced in the GaN self-standing substrate thus fabricated. Especially, it is frequently observed that a region with a high dislocation density is locally generated on the substrate surface.

If the crystal growth is continued while leaving facets of concaves generated on the crystal growth interface, the region with dislocations densely gathered always remains on the growth surface. In the DEEP abovementioned, which is a method for intentionally using the dislocation-reduced region generated between the regions with dislocations densely gathered, uniformity in dislocation density distribution on the entire substrate surface must be sacrificed although a region with significantly reduced dislocation density can be obtained.

Japanese patent application laid-open No. 2003-178984 discloses that the crystal growth interface is flattened by terminating the facet growth by increasing the amount of hydrogen mixed into carrier gas or by changing the crystal growth conditions in process of the crystal growth, and dislocations gathered at the bottom region of pit are dispersed again as the crystal growth goes on.

However, in conventional manner, the growth of substrate and the polishing are performed without considering the dislocation density distribution in a depth direction of substrate. Therefore, it was in fact impossible to obtain a substrate surface that gathered dislocations are perfectly dispersed, or a substrate surface obtainable when dislocations are uniformly dispersed was unintentionally removed by polishing at the substrate surface. As a result, the substrate surface being mirror-finished had frequently a highly dispersed distribution in dislocation density.

When such a region with dislocations densely gathered is left on the substrate surface, a device with epitaxial layers grown thereon must have a deteriorated characteristic. For example, the output of a laser diode will lower and the lifetime thereof will be shortened.

SUMMARY OF THE INVENTION

It is an object of the invention to provide a III–V group nitride system semiconductor self-standing substrate that has a predetermined thickness of surface layer with a substantially uniform dislocation density distribution as well as with a reduced dislocation density.

It is a further object of the invention to provide a method of making the III–V group nitride system semiconductor self-standing substrate with a good reproducibility.

It is a further object of the invention to provide a III–V group nitride system semiconductor wafer that a III–V group nitride system semiconductor layer with a high crystalline uniformity is epitaxially grown on the substrate.

The inventor focused on that it is important to consider a dislocation density distribution in a depth direction of substrate in order to fabricate a light emitting device with uniform characteristic at a good production yield on a III–V group nitride system semiconductor substrate. Based on the consideration, he found that, when a dislocation density distribution near the surface (e.g., at least a region up to a 10 μm depth from the upper surface) of a III–V group nitride system semiconductor substrate is substantially uniform, the surface morphology or uniformity in characteristic of a GaN system epitaxial layer to be grown thereon is not deteriorated. Thus, the invention is completed based on the finding.

(1) According to the first aspect of the invention, a III–V group nitride system semiconductor self-standing substrate comprises:

III–V group nitride system semiconductor crystal, wherein the substrate has a dislocation density distribution that is substantially uniform at least at a surface of the substrate.

It is preferred that the substrate has a dislocation density distribution that is substantially uniform at an arbitrary cross section that is in parallel to the surface of the substrate and is located up to 10 μm from the surface of the substrate.

Further, it is preferred that the substrate has an average dislocation density of $5 \times 10^7$ cm$^{-2}$ or less at an arbitrary cross section that is in parallel to the surface of the substrate and is located up to 10 μm from the surface of the substrate, and the number of dislocation lines intersecting a unit area of 400 μm$^2$ at an arbitrary position on the cross section is less than 400.

(2) According to the second aspect of the invention, a III–V group nitride system semiconductor self-standing substrate comprises:

III–V group nitride system semiconductor crystal, wherein the substrate comprises:

a first III–V group nitride system semiconductor crystal layer that comprises a region with dislocation lines gathered densely, the dislocation lines being gathered substantially perpendicular to a surface of the substrate, and a region with dislocation lines gathered thinly; and a second III–V group nitride system semiconductor crystal layer that is formed up to 10 μm from the surface of the substrate on the first III–V group nitride system semiconductor crystal layer and that has a dislocation density distribution that is substantially uniform.

It is preferred that the dislocation density distribution varies continuously between the first III–V group nitride system semiconductor crystal layer and the second III–V group nitride system semiconductor crystal layer.

The substrate has a dislocation density of, preferably, $5 \times 10^7$ cm$^{-2}$ or less, more preferably, $5 \times 10^6$ cm$^{-2}$ or less at a surface of the substrate.

It is preferred that the substrate has an average dislocation density at a surface of the substrate that is lower than an average dislocation density at a back surface of the substrate.

Further, it is preferred that the substrate has a dispersion range of dislocation density at a surface of the substrate that is the same as or smaller than a dispersion range of dislocation density at a back surface of the substrate.

It is preferred that the first III–V group nitride system semiconductor crystal layer comprises a plurality of the regions with dislocation lines gathered densely, and the regions are separated with an interval of μ10 m or more from each other.

It is preferred that the substrate has the upper and/or lower surface polished.

It is preferred that the substrate has (0001) III-group face at the surface.

It is preferred that the substrate has a thickness of 200 μm or more and 1 mm or less.

The III–V group nitride system semiconductor crystal can have a composition represented by $In_xGa_yAl_{1-x-y}N$ ($0 \leq x \leq 1$, $0 \leq y \leq 1$, $0 \leq x+y \leq 1$).

It is preferred that the III–V group nitride system semiconductor crystal is doped with an impurity.

(3) According to the third aspect of the invention, a method of making a III–V group nitride system semiconductor self-standing substrate comprises the steps of:

growing a III–V group nitride system semiconductor crystal while generating a plurality of concaves on a crystal growth interface;

flattening the crystal growth interface by growing the III–V group nitride system semiconductor crystal to fill the plurality of concaves, whereby dislocation lines generated in the crystal are gathered while reducing a dislocation density of the entire III–V group nitride system semiconductor crystal, and a first III–V group nitride system semiconductor crystal layer is formed that comprises a region with dislocation lines gathered densely, the dislocation lines being gathered substantially perpendicular to a surface of the substrate, and a region with dislocation lines gathered thinly; and subsequently growing the crystal while keeping the crystal growth interface flattened, whereby a transitional layer is formed that the dislocation lines once gathered are uniformly dispersed again in the crystal, and a second III–V group nitride system semiconductor crystal layer is formed with a thickness of 10 μm or more on the transitional layer, the second III–V group nitride system semiconductor crystal layer having a low dislocation density and a substantially uniform dislocation density distribution.

Herein, the concave is also called pit or groove as shown in FIG. 4D, FIG. 10F or FIG. 12E.

(4) According to the fourth aspect of the invention, a method of making a III–V group nitride system semiconductor self-standing substrate comprises the steps of:

growing a III–V group nitride system semiconductor crystal while generating a plurality of concaves on a crystal growth interface;

flattening the crystal growth interface by growing the III–V group nitride system semiconductor crystal to fill the plurality of concaves, whereby dislocation lines generated in the crystal are gathered while reducing a dislocation density of the entire III–V group nitride system semiconductor crystal, and a first III–V group nitride system semiconductor crystal layer is formed that comprises a region with dislocation lines gathered densely, the dislocation lines being gathered substantially perpendicular to a surface of the substrate, and a region with dislocation lines gathered thinly;

subsequently growing the crystal while keeping the crystal growth interface flattened, whereby a transitional layer is formed that the dislocation lines once gathered are uniformly dispersed again in the crystal, and a second III–V group nitride system semiconductor crystal layer is formed with a thickness of 10 μm or more on the transitional layer, the second III–V group nitride system semiconductor crystal layer having a low dislocation density and a substantially uniform dislocation density distribution; and polishing a surface of the substrate such that the second III–V group nitride system semiconductor crystal layer has a thickness of 10 μm or more after the polishing.

(5) According to the fifth aspect of the invention, a method of making a III–V group nitride system semiconductor self-standing substrate comprises the steps of:

growing a III–V group nitride system semiconductor crystal on a hetero-substrate while generating a plurality of concaves on a crystal growth interface;

flattening the crystal growth interface by growing the III–V group nitride system semiconductor crystal to fill the plurality of concaves, whereby dislocation lines generated in the crystal are gathered while reducing a dislocation density of the entire III–V group nitride system semiconductor crystal, and a first III–V group nitride system semiconductor crystal layer is formed that comprises a region with dislocation lines gathered densely, the dislocation lines being gathered substantially perpendicular to a surface of the substrate, and a region with dislocation lines gathered thinly;

subsequently growing the crystal while keeping the crystal growth interface flattened, whereby a transitional layer is formed that the dislocation lines once gathered are uniformly dispersed again in the crystal, and a second III–V group nitride system semiconductor crystal layer is formed with a thickness of 10 μm or more on the transitional layer, the second III–V group nitride system semiconductor crystal layer having a low dislocation density and a substantially uniform dislocation density distribution; and separating the III–V group nitride system semiconductor crystal grown on the hetero-substrate from the hetero-substrate.

(6) According to the sixth aspect of the invention, a method of making a III–V group nitride system semiconductor self-standing substrate comprises the steps of:

growing a III–V group nitride system semiconductor crystal on a hetero-substrate while generating a plurality of concaves on a crystal growth interface;

flattening the crystal growth interface by growing the III–V group nitride system semiconductor crystal to fill the plurality of concaves, whereby dislocation lines generated in the crystal are gathered while reducing a dislocation density of the entire III–V group nitride system semiconductor crystal, and a first III–V group nitride system semiconductor crystal layer is formed that comprises a region with dislocation lines gathered densely, the dislocation lines being gathered substantially perpendicular to a surface of the substrate, and a region with dislocation lines gathered thinly;

subsequently growing the crystal while keeping the crystal growth interface flattened, whereby a transitional layer is formed that the dislocation lines once gathered are uniformly dispersed again in the crystal, and a second III–V group nitride system semiconductor crystal layer is formed with a thickness of 10 μm or more on the transitional layer, the second III–V group nitride system semiconductor crystal layer having a low dislocation density and a substantially uniform dislocation density distribution;

separating the III–V group nitride system semiconductor crystal grown on the hetero-substrate from the hetero-substrate; and subsequently polishing a surface of the substrate such that the second III–V group nitride system semiconductor crystal layer has a thickness of 10 μm or more after the polishing.

(7) According to the seventh aspect of the invention, a method of making a III–V group nitride system semiconductor self-standing substrate comprises the steps of:

growing a III–V group nitride system semiconductor crystal while generating a plurality of concaves on a crystal growth interface;

flattening the crystal growth interface by growing the III–V group nitride system semiconductor crystal to fill the plurality of concaves, whereby dislocation lines generated in the crystal are gathered while reducing a dislocation density of the entire III–V group nitride system semiconductor crystal, and a first III–V group nitride system semiconductor crystal layer is formed that comprises a region with dislocation lines gathered densely, the dislocation lines being gathered substantially perpendicular to a surface of the substrate, and a region with dislocation lines gathered thinly;

subsequently growing the crystal while keeping the crystal growth interface flattened, whereby a transitional layer is formed that the dislocation lines once gathered are uniformly dispersed again in the crystal, and a second III–V group nitride system semiconductor crystal layer is formed with a thickness of 10 µm or more on the transitional layer, the second III–V group nitride system semiconductor crystal layer having a low dislocation density and a substantially uniform dislocation density distribution; and removing part of the first III–V group nitride system semiconductor crystal layer.

(8) According to the eighth aspect of the invention, a method of making a III–V group nitride system semiconductor self-standing substrate comprises the steps of:

growing a III–V group nitride system semiconductor crystal on a hetero-substrate while generating a plurality of concaves on a crystal growth interface;

flattening the crystal growth interface by growing the III–V group nitride system semiconductor crystal to fill the plurality of concaves, whereby dislocation lines generated in the crystal are gathered while reducing a dislocation density of the entire III–V group nitride system semiconductor crystal, and a first III–V group nitride system semiconductor crystal layer is formed that comprises a region with dislocation lines gathered densely, the dislocation lines being gathered substantially perpendicular to a surface of the substrate, and a region with dislocation lines gathered thinly;

subsequently growing the crystal while keeping the crystal growth interface flattened, whereby a transitional layer is formed that the dislocation lines once gathered are uniformly dispersed again in the crystal, and a second III–V group nitride system semiconductor crystal layer is formed with a thickness of 10 µm or more on the transitional layer, the second III–V group nitride system semiconductor crystal layer having a low dislocation density and a substantially uniform dislocation density distribution;

separating the III–V group nitride system semiconductor crystal grown on the hetero-substrate from the hetero-substrate; and subsequently removing part of the first III–V group nitride system semiconductor crystal layer.

It is preferred that the removing step is conducted by polishing a back surface of the substrate so as not to have a thickness of the substrate 200 µm or less.

It is preferred that the method further comprises the step of: mirror-polishing a surface of the substrate so as not to have a thickness of the substrate 200 µm or less.

It is preferred that the method further comprises the step of: removing all the first III–V group nitride system semiconductor crystal layer.

It is preferred that the second III–V group nitride system semiconductor crystal layer is grown thick; and the method further comprises the step of: cutting the second III–V group nitride system semiconductor crystal layer in a direction perpendicular to the growth direction of the crystal to obtain the substrate.

In the method using a hetero-substrate, it is preferred that the method further comprises the step of:

cutting the second III–V group nitride system semiconductor crystal layer in a direction perpendicular to the growth direction of the crystal to obtain the substrate.

It is preferred that the method further comprises the step of: polishing upper and lower surfaces of the substrate obtained by the cutting step.

It is preferred that part of the crystal growth is conducted by using the HVPE method.

The flattening step may be conducted such that a concentration of hydrogen in growth atmosphere gas is increased in process of the crystal growth such that the concaves on the crystal growth interface are filled to flatten the crystal growth interface.

Further, the flattening step may be conducted such that a partial pressure of III-group source gas is increased in process of the crystal growth such that the concaves on the crystal growth interface are filled to flatten the crystal growth interface.

In the step of growing the crystal while generating the plurality of concaves, the concave may be V-shaped or inverted trapezoidal or cone-shaped in cross section parallel to a growth direction of the crystal while being surrounded by facets.

(9) According to the ninth aspect of the invention, a III–V group nitride system semiconductor wafer comprises:

a self-standing substrate that is of III–V group nitride system semiconductor crystal, the substrate having a dislocation density distribution that is substantially uniform at a surface layer up to 10 µm from a surface of the substrate; and a III–V group nitride system semiconductor layer that is homo-epitaxially grown on the self-standing substrate.

<Advantages of the Invention>

By virtue of the self-standing substrate of the invention, when an epitaxial growth layer of nitride system semiconductor is grown on the III–V group nitride system semiconductor self-standing substrate, distortion is less likely to be accumulated. Along with this, an epitaxial growth layer with good crystalline quality can be obtained since temperature in growth interface is sufficiently uniformed during the crystal growth. Further, due to the less accumulation in distortion, it is less likely to occur that the substrate is split or chipped during the fabrication process.

Further, by virtue of the method of the invention, a III–V group nitride system semiconductor self-standing substrate can be obtained that has a low dislocation density and a substantially uniform dislocation density distribution at the surface, with stability and good reproducibility.

Further, by virtue of the invention, the III–V group nitride system semiconductor wafer can be provided with an epitaxial growth layer with enhanced crystalline quality, good uniformity and less accumulation in distortion. Therefore, in fabricating a device such as a light emitting device or electronic device, enhancement in device characteristics or production yield can be estimated.

BRIEF DESCRIPTION OF THE DRAWINGS

The preferred embodiments according to the invention will be explained below referring to the drawings, wherein:

FIGS. 4A to 4G are cross sectional views showing a method of making the GaN self-standing substrate in a first preferred embodiment according to the invention;

FIGS. 12A to 12I are cross sectional views showing a method of making the GaN self-standing substrate in a fourth preferred embodiment according to the invention.

DETAILED DESCRIPTION OF THE PREFERRED EMBODIMENTS

The invention is intended to provide a III–V group nitride system semiconductor substrate that has a predetermined thickness of surface layer with a substantially uniform dislocation density distribution as well as with a reduced dislocation density, in order to fabricate a light emitting device with uniform characteristic at a good production yield on the III–V group nitride system semiconductor substrate.

<Principle to Obtain a Surface Layer with a Substantially Uniform Dislocation Density Distribution>

A principle to obtain a III–V group nitride system semiconductor substrate that has a surface layer with a substantially uniform dislocation density distribution as well as with a reduced dislocation density will be explained below.

Figure 1:
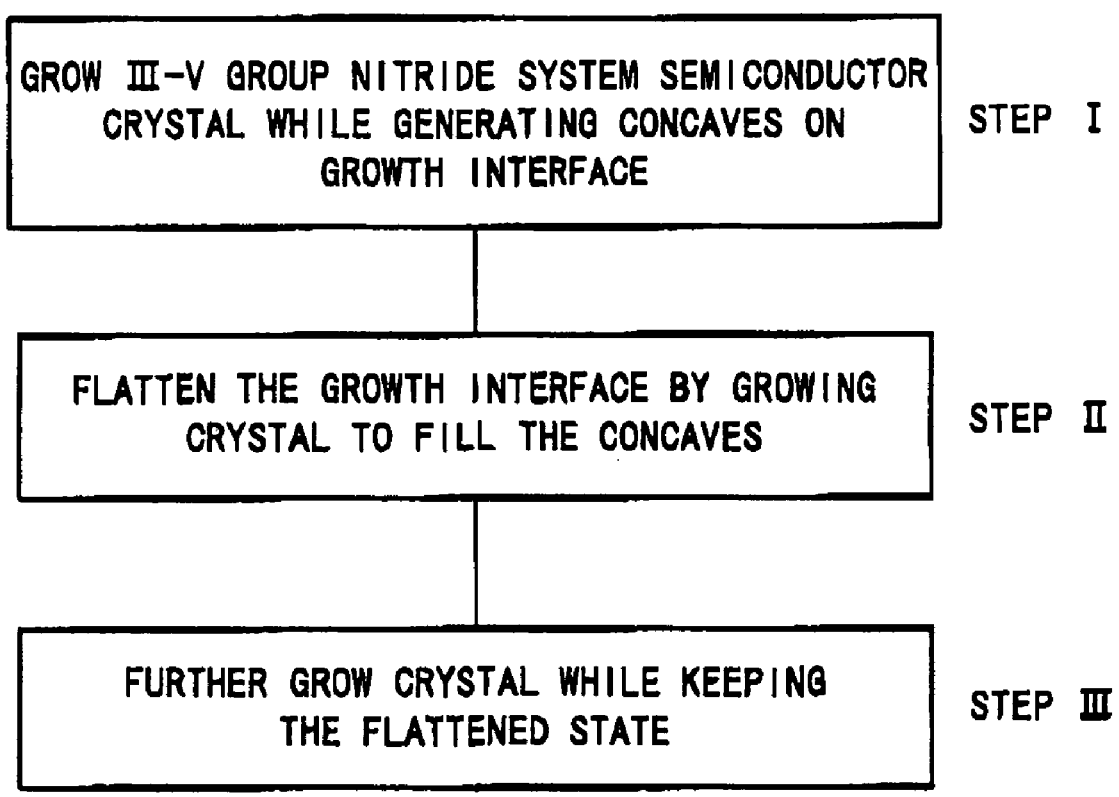
FIG. 1 is a flow chart showing a schematic method of making a III–V group nitride system semiconductor substrate according to the invention.

FIG. 1 is a flow chart showing a schematic method of making a III–V group nitride system semiconductor substrate according to the invention.

At first, a crystal of III–V group nitride system semiconductor is grown while generating concaves on its growth interface (Step I). For example, when the crystal growth is continued intentionally leaving concaves to form facets on the growth interface at the initial growth stage of III–V group nitride system semiconductor substrate, the propagation direction of a dislocation propagating during the crystal growth is bent by the facet plane. On the other hand, when the crystal is grown generating a pit surrounded by facets at the crystal growth interface, dislocations are densely gathered at the bottom region of pit. Due to the collecting of dislocations, the dislocations can be eliminated while running into each other, or the penetration of dislocation toward the upper surface can be stopped while having a dislocation loop. Thereby, the dislocation density can be reduced effectively. Thus, by growing the crystal of III–V group nitride system semiconductor while generating the concaves on the growth interface, the propagation direction of dislocation can be gathered while being bent, and the dislocations reaching the substrate surface can be reduced. Thereby, the dislocation density can be reduced as a whole.

Next, by growing the crystal to fill the concaves, the growth interface is flattened (Step II).

If Step I is continued such that the crystal is grown leaving the concaves to form facets on the growth interface, a region with dislocations densely gathered will be left on the crystal surface. In order to avoid this, by terminating the facet growth by increasing the amount of hydrogen mixed into carrier gas or by changing the crystal growth conditions in process of the crystal growth, the crystal growth interface is flattened.

Finally, the crystal growth is conducted flattening the growth interface so as to form a transitional layer where the dislocation line gathered once is dispersed again, and then a crystal layer is grown 10 μm or more thereon that the dislocation line is uniformly dispersed (Step III).

When the crystal growth interface is flattened, dislocations gathered at the bottom region of pit are dispersed again as the crystal growth goes on. In order to control such that the dislocation line gathered once is dispersed again and substantially uniformly dispersed in the III–V group nitride system semiconductor layer, the crystal needs to be grown 10 μm or more, preferably 30 μm or more in the flattening state. Thus, by conducting the crystal growth while flattening the growth interface to grow a layer of at least 10 μm or more with the dislocation line substantially uniformly dispersed, the surface morphology or uniformity in characteristic of a GaN system epitaxial layer to be grown thereon can be improved.

<Method of Making a III–V Group Nitride System Semiconductor Substrate>

Figure 2:
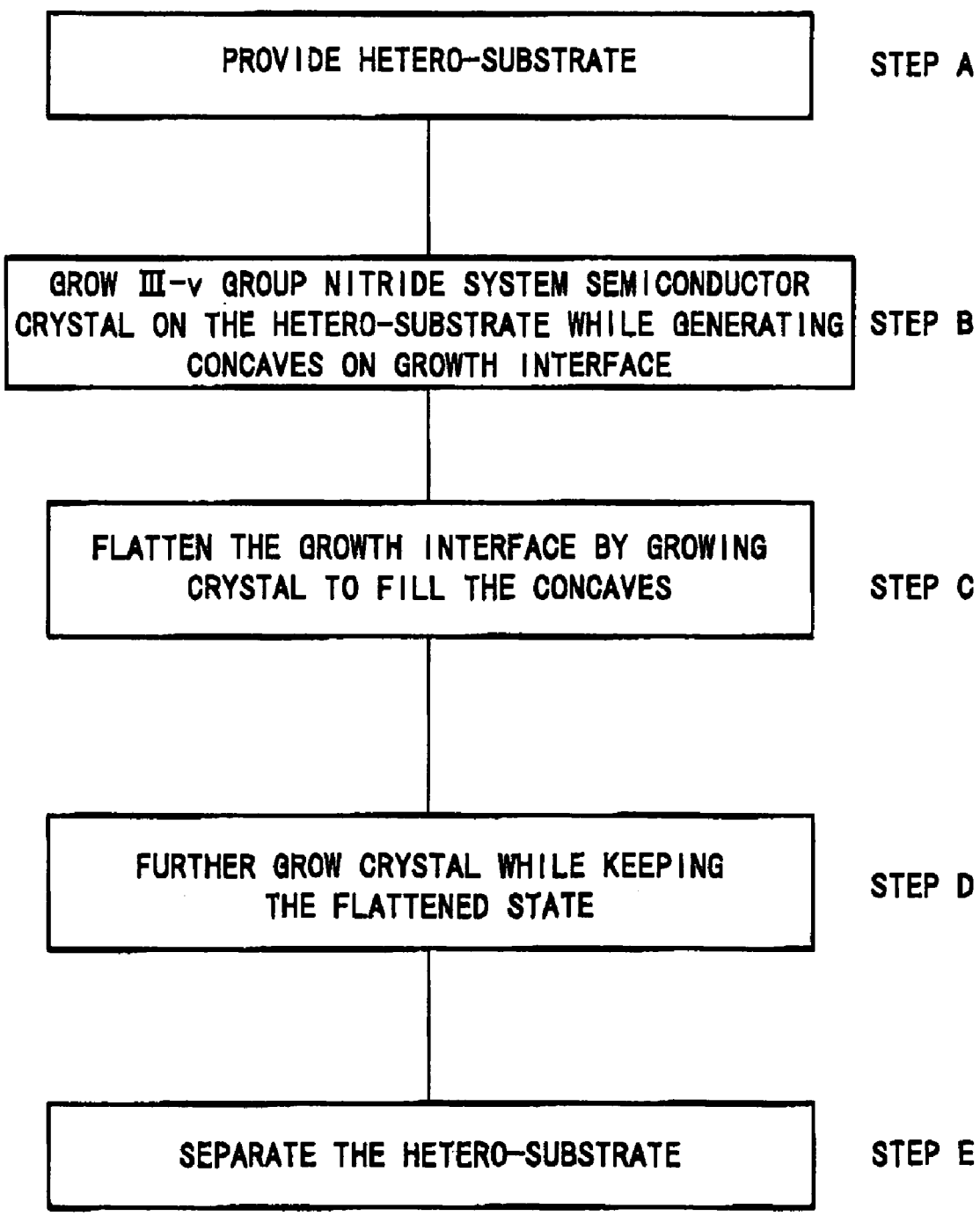
FIG. 2 is a flow chart showing a detailed method of making the III–V group nitride system semiconductor substrate according to the invention.

The method of making a III–V group nitride system semiconductor substrate using a hetero-substrate based on the abovementioned principle according to the invention will be explained below referring to FIG. 2.

At first, a hetero-substrate such as a sapphire substrate is provided (Step A). The sapphire substrate is preferable because it is stable at a high-temperature region of 1000° C. or higher that is a growth temperature of GaN crystal, and it does not react with $H_2$, $NH_3$ and HCl that are a source gas or atmospheric gas for crystal growth.

Then, the III–V group nitride system semiconductor crystal is grown on the hetero-substrate while generating concaves on the growth interface (Step B).

The III–V group nitride system semiconductors available are represented by $In_xGa_yAl_{1-x-y}N$ ($0 \leq x \leq 1$, $0 \leq y \leq 1$, $0 \leq x+y \leq 1$). Of these, GaN and AlGaN are preferably used. This is because they satisfy properties required to a substrate material such as strength and stability in manufacture.

It is desirable that the upper surface of epitaxial growth layer has (0001) III-group face. This is because, although GaN system crystals have a strong polarity, its III-group face is more stable in chemical and thermal aspects than its V-group face and therefore facilitates the fabrication of a device.

In the case of making a self-standing substrate by separating an epitaxial growth layer from the hetero-substrate after the crystal growth, it is preferable to use the HVPE method with a high crystal growth rate.

In order to generate the concaves during the crystal growth, the partial pressure of hydrogen in carrier gas is lowered. Alternatively, by using the FIELO method, it may be conducted while forming facets at the opening of silicon dioxide (mask).

A first layer is formed by using two steps, i.e., a step of growing it while generating concaves (Step B) and a step of flattening the crystal growth surface (Step C). By virtue of the two steps, the entire crystal can have a reduced dislocation density as dislocation lines generated in the crystal are gathered. The dislocation lines are gathered around an axis nearly perpendicular to the flattened crystal interface and, thus, the first layer is formed having a region with dislocation lines densely gathered and a region with dislocation lines thinly gathered.

Although it is effective to increase the partial pressure of hydrogen in carrier gas in process of the vapor phase growth, when the partial pressure of hydrogen or GaCl is to a certain degree high from the initial stage of crystal growth, the growth interface can be flattened without changing the growth conditions in process of the crystal growth stage. Alternatively, the growth interface can be flattened by doping an impurity such as Mg to promote the lateral growth of III–V group nitride system semiconductor.

Then, the crystal growth is continued while keeping the shape of flattened crystal growth interface (Step D). Thereby, a transitional layer is formed that the dislocation lines gathered once are uniformly dispersed again in the crystal. Further, a second layer of III–V group nitride system semiconductor crystal with a substantially uniform dislocation density distribution as well as a reduced dislocation density is 10 μm or more formed thereon.

The transitional layer needs to be 10 μm or more, desirably 30 μm or more so as to disperse the dislocation lines uniformly. Although it is above mentioned that the second layer with a substantially uniform dislocation density distribution as well as a reduced dislocation density is 10 μm or more formed from the upper surface, it is desirable that the second layer is 50 μm or more formed therefrom. The reason why the second layer needs to be 10 μm or more is that an epitaxial growth layer to be formed on the second layer needs to be separated from the first layer with nonuniform specific heat so as to grow the epitaxial layer with a good crystalline quality.

Then, the epitaxial growth layer of III–V group nitride system semiconductor is separated from the hetero-substrate (Step E). The separation of hetero-substrate may be conducted by VAS or etching. Of these, the VAS is desirably used. In the VAS, the amount of warping generated in grown GaN substrate is relatively small. Therefore the substrate can be made with a reduced dispersion in dislocation density.

<Surface Polishing>

The resulting III–V group nitride system semiconductor substrate is desirably mirror-finished at its surface by polishing. In general, the as-grown surface of III–V group nitride system semiconductor epitaxial layer grown thickly has large uneven patterns such as hillock or a number of microscopic uneven patterns assumed to be generated due to the step bunching. These may cause a deterioration in morphology of epitaxial layer grown thereon or a nonuniformity in film thickness or composition, and moreover, in the device fabrication process, may cause a reduction in exposure accuracy of photolithography. Therefore, it is desirable that the surface of substrate is provided with a flat mirror surface.

In order to having the mirror surface by polishing, several micrometers or hundreds of micrometers from the surface need to be polished and removed. In the invention, even after removing the surface layer by polishing, 10 μm or more layer with a substantially uniform dislocation density distribution needs to be left. Therefore, in polishing the surface of substrate, the layer with a substantially uniform dislocation density distribution should be thickly grown in the crystal growth stage previously in consideration of a polished portion depth. Therefore, the second layer should have a depth of at least 10 μm plus the depth of polished portion before mirror-finishing the surface layer by polishing.

<Lower(Back) Surface Polishing>

If the substrate has a warping, the back surface of substrate may not be in contact with a susceptor when growing the epitaxial layer as device structure on the substrate. In such a case, heat conduction to the substrate will be not uniform and, thereby, a temperature distribution will be generated in the plane of substrate. Due to the in-plane temperature distribution, during the epitaxial growth, dispersion in grown film thickness, composition, impurity concentration etc. will occur. Thus, since it is impossible to offer the in-plane uniform growth, dispersion in device characteristics will be thereby increased. From the above reasons, it is desirable that both surfaces of the substrate are mirror-finished by polishing.

<Self-Standing Substrate>

Herein, a self-standing substrate means a substrate that can hold its shape by itself and has a sufficient strength for handling. In order to provide such a strength, the thickness of self-standing substrate needs to be preferably 200 μm or more. Also, in view of easiness in cleavage after the device fabrication, the thickness of self-standing substrate is preferably 1 mm or less. If it is greater than 1 mm, it becomes difficult to cleave the substrate and the cleavage surface is subjected to unevenness. As a result, if it is applied to a semiconductor laser etc., the device characteristics will deteriorate due to the reflection loss.

Figure 3:
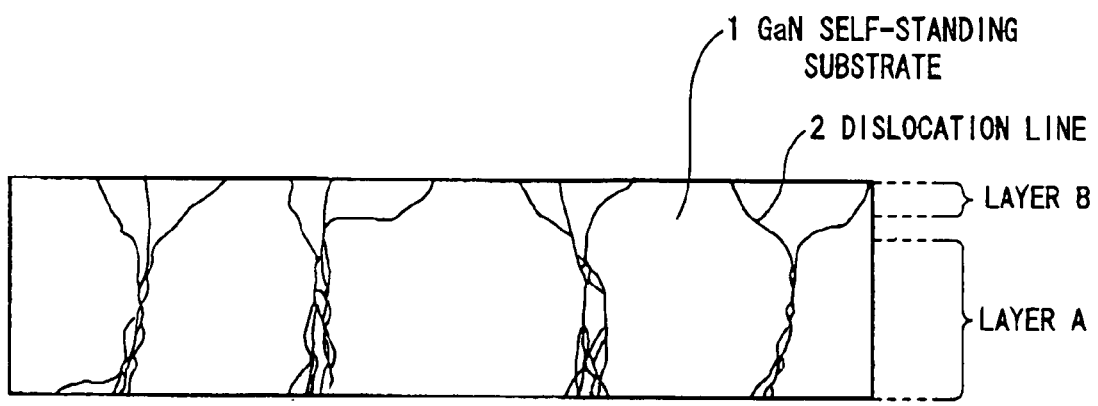
FIG. 3 is an illustrative cross sectional view showing a dislocation distribution of GaN self-standing substrate according to the invention.

FIG. 3 is an illustrative cross sectional view showing a GaN self-standing substrate according to the invention.

The GaN self-standing substrate 1 is roughly classified into a first layer (layer A) that has a region (a region with dislocation lines densely gathered) where dislocation lines 2 are densely gathered, and a second layer (layer B) that has a substantially uniform dislocation density distribution. The second layer has a thickness of 10 μm or more and is formed up to the surface of GaN self-standing substrate 1. When the region with dislocation lines densely gathered is cut in parallel to the surface of GaN self-standing substrate 1, its cross section includes 400 to 40000 dislocation lines that intersect a unit area of 400 μm$^2$ in the region. Thus, the first layer can be defined as a layer that, at a region in an arbitrary cross section in parallel to the substrate surface, the number of dislocation lines that intersect a unit area of 400 μm$^2$ is 400 to 40000. On the other hand, the second layer can be defined as a layer that an average dislocation density in an arbitrary cross section at a depth of up to 10 μm from the substrate surface and in parallel to the substrate surface is $5 \times 10^7$ cm$^{-2}$ or less, and the number of dislocation lines that intersect a unit area of 400 μm$^2$ is lass than 400 in an arbitrary region of the cross section.

<Dislocation Density>

Herein, "dislocation density" is the number of dislocation lines that intersect a unit area, and the number is generally counted in a unit area of hundreds to thousands of μm². In general, the unit area is set such that the number of dislocation lines to intersect the unit area is 100 or so. "average dislocation density" is calculated as an average of plurality of dislocation densities that are measured at in the plane of substrate.

In general, a dispersion of dislocation density is defined by (a) (maximum value−minimum value) of dislocation densities/(=divided by) an average value thereof, (b) deviation from the average value, or (c) a standard deviation of dislocation densities. In this specification, "dispersion in dislocation density" means a value calculated by (a) (maximum value−minimum value) of dislocation densities/an average value thereof.

<Absolute Value of Dislocation Density>

Although an absolute value of dislocation density of III–V group nitride system semiconductor substrate is preferred to be small as much as possible, its upper limit cannot be specifically determined since it varies depending on a targeted device.

In light emitting devices, as the emission wavelength of a targeted device is shortened, its substrate needs to have a lower dislocation density.

Further, a laser diode (LD) needs to have a dislocation density lower than a light emitting diode (LED).

Even in case of LED, an average dislocation density of $5 \times 10^7$ cm$^{-2}$ or less is required so that reliability sufficient for practical use can be secured. In case of LD, an average dislocation density of $5 \times 10^6$ cm$^{-2}$ or less is generally required that is one digit lower than LED.

<Substantially Uniform Dislocation Density Distribution>

Herein, "dislocation density distribution is substantially uniform" does not mean that dislocation density distribution is perfectly uniform regardless of a position on substrate, and it does mean that dispersion in dislocation density is small such that the characteristic of a device formed on a substrate becomes constant.

The value of dispersion cannot be specifically determined since it should be determined by a targeted device or process. As described earlier, the dispersion in dislocation density is calculated by (a) (maximum value−minimum value) of dislocation densities/an average value thereof.

The allowable range of dispersion in dislocation density increases as the absolute value of dislocation density decreases. This is because influence on device characteristic by an increase in dispersion is lessened as the dislocation density decreases. For example, when an average dislocation density is $1 \times 10^7$ cm$^{-2}$, it is desirable that its dispersion is within 200%. When an average dislocation density is $1 \times 10^6$ cm$^{-2}$, it is desirable that its dispersion is within 400%.

<Region with Dislocation Lines Densely Gathered>

Although a region with dislocation lines gathered densely on crystal surface cannot be recognized with eyes, pits corresponding to the dislocations can be generated by soaking the substrate surface in heated solution of phosphoric acid and sulfuric acid. By observing a distribution of the etched pits by a microscope, the region with dislocation lines gathered densely can be easily detected. Alternatively, the distribution of dislocations can be detected by a transmission electron microscope or cathodoluminescence image.

<Conduction Type of Substrate>

The conduction type of self-standing substrate should be suitably controlled in accordance with a targeted device and cannot be specifically determined. Conduction types applicable to the invention are, for example, n-type that can be provided by doping Si, S, O etc., p-type that can be provided by doping Mg, Zn etc., semi-insulation type that can be provided by doping Fe, Cr etc., or by simultaneously doping n-type and p-type dopants. Further, the absolute value of carrier concentration of self-standing substrate cannot be specifically determined since it should be suitably controlled in accordance with a targeted device.

<Cutting of III–V Group Nitride System Semiconductor Substrate Layer>

In the invention, a thick III–V group nitride system semiconductor layer is epitaxially grown, and then it is cut away in order to offer a self-standing substrate. It is preferable that the self-standing substrate being cut away from the thick grown III–V group nitride system semiconductor crystal is finished by polishing at its upper and lower surfaces. This is because the cutting face of crystal normally has an uneven pattern such as a saw mark that may be introduced in the cutting and it is difficult to conduct the epitaxial growth thereon while leaving the face as it is. In cutting the crystal, an OD-blade slicer, an ID-blade slicer, a wire saw etc. can be used. Especially, the wire saw is preferable.

Although the concept of the invention is applied to the self-standing substrate made of III–V group nitride system semiconductor, it can be applied to a III–V group nitride system semiconductor epitaxial substrate (template) with an underlying substrate.

The invention is detailed with reference to the following embodiments, but it is not limited to them.

<First Embodiment>

[Manufacturing of a GaN self-standing substrate that a layer with a substantially uniform dislocation density distribution is formed on a layer that has a region with dislocation lines gathered densely and a region with dislocation lines thinly gathered]

A GaN epitaxial layer is formed on a sapphire substrate, and then the sapphire substrate is removed. Thus, a GaN self-standing substrate is manufactured and evaluated that, as schematically shown in FIG. 3, layer B with a substantially uniform dislocation density distribution is formed on layer A that has a region with dislocation lines gathered densely and a region with dislocation lines thinly gathered.

Referring to FIGS. 4A to 4G, a method of making the GaN self-standing substrate in this embodiment of the invention will be explained below.

First, using a sapphire substrate 11 as shown in FIG. 4A, GaN crystal 12 is epitaxially grown by HVPE. The HVPE is a method that GaCl as III-group element halide is transported to the heated surface of substrate and mixed with NH$_3$ on the substrate region, whereby they are reacted with each other to offer the vapor-phase growth of GaN crystal on the substrate. The source gases are flown with a carrier gas such as H$_2$ or N$_2$. The temperature of substrate region is set to be 1000° C. by using an electric oven. Further, during the growth process of GaN crystal, Si is doped supplying SiH$_x$Cl$_2$ as doping source gas to the substrate region.

The partial pressures of GaCl, NH$_3$ as source gas are set to be $5 \times 10^{-3}$ atm and 0.3 atm, respectively on the substrate region. The carrier gas is mixed gas of 2% H$_2$ and 98% N$_2$. Under these conditions, the crystal growth proceeds such that nuclei of GaN crystal are grown like three-dimensional islands on the sapphire substrate 11 and then facets are generated on the sidewall of nucleus (Step B, FIG. 4B). This behavior is checked by conducting the microscopic observation of the surface and cross section of substrates taken out of the oven while changing the growth time.

As the growth time is increased, the top portion of GaN crystal 12 is flattened (Step C, FIG. 4C). Then, the crystals are grown laterally and then coalesced to each other and, thus, the flattening of surface is advanced.

However, the growth interface is not perfectly flattened and a number of pits 13 are left surrounded by the facets on the surface. The crystal growth proceeds such that a number of dislocation lines 14 generated at the hetero-growth interface of the sapphire substrate 11 and the GaN crystal 12 have its propagation direction bent toward the bottom of pit 13 surrounded by the facets (Step D, FIG. 4D). The pit 13 is, viewing from directly above, around circular and has a diameter of several μm to several tens of μm.

After growing the GaN crystal 12 until the state in Step D, the crystal growth proceeds generating a number of uneven portions on the crystal growth interface. Thereby, since the dislocation lines 14 generated within the crystal are gathered, the dislocation density can be reduced in the entire crystal. Then, keeping the flow rate of source gases as it is, and changing only the carrier gas into mixed gas of 10% $H_2$ and 90% $N_2$, the growth of GaN crystal 12 is continued. As a result, it is observed that the growth interface of GaN crystal 12 is flattened (Step E, FIG. 4E). In the step conducted thus far, a region 15 with high dislocation density is formed. After the growth interface of GaN crystal 12 is flattened, the GaN crystal 12 is further grown to have a thickness of 100 μm or more. Finally, the GaN crystal 12 with a total thickness of 250 μm is grown on the sapphire substrate 11 (Step F, FIG. 4F). In Step F, the dislocation lines 14 are dispersed again that were once gathered having the region 15 with high dislocation density. Thereby, a stabilized layer with uniform dislocation density distribution is formed. Meanwhile, the GaN crystal 12 is grown at an average growth rate of about 50 μm/h.

Then, the sapphire substrate 11 with the GaN epitaxial layer 12 thus formed is taken out from a reaction tube, and then the GaN self-standing substrate 16 is obtained by removing the sapphire substrate 11 (Step G, FIG. 4G). In order to remove the sapphire substrate 11, so-called laser lift-off method is used that high-output ultraviolet laser light with a wavelength that passes through the sapphire substrate 11 but is absorbed by GaN is irradiated to the side of sapphire substrate 11 so as to melt the interface of GaN crystal and sapphire substrate. Alternatively, mechanical polishing or etching by strong alkali or acid reagent may be used to remove the sapphire substrate 11. Further, physical etching by charged beam or neutral beam may be conducted to remove the sapphire substrate 11.

The distribution of dislocations is observed by that the GaN self-standing substrate 16 separated from the sapphire substrate 11 is cleaved and its cross section is subjected to observation using TEM (transmission electron microscope).

Figure 5:
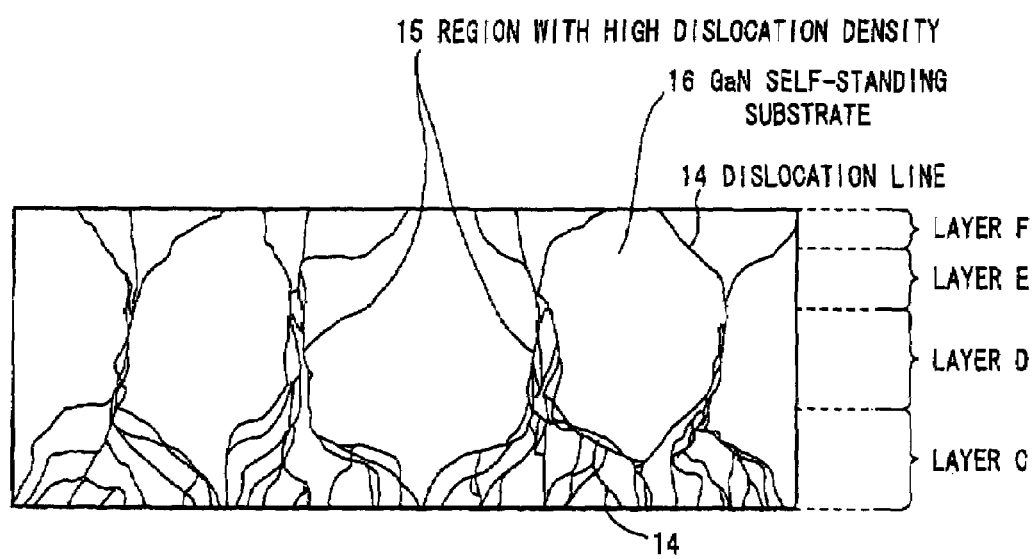
FIG. 5 is an illustrative cross sectional view showing a dislocation distribution of GaN self-standing substrate before the steps of polishing the surface and/or back side in the first embodiment.

FIG. 5 is an illustrative cross sectional view showing a dislocation distribution of GaN self-standing substrate in the first embodiment. The dislocation distribution in the GaN self-standing substrate 16 is, as shown in FIG. 5, classified into four layers C to F. Layer C is structured such that the dislocation lines 14 generated at the hetero-growth interface of the sapphire substrate 11 and the GaN crystal 12 are bent in its propagation direction toward the bottom of pit surrounded by facets and thereby the gathered region 15 with high dislocation density is formed. Layer D is structured such that the collecting of dislocations is continued and thereby a number of regions 15 with high dislocation density are formed in the GaN crystal. In the formation stage of this layer, the pits are still left on the crystal growth interface. Layer E is a transitional layer structured such that, due to the change of carrier gas composition during the crystal growth, the crystal growth interface is flattened and thereby the dislocation lines 14 gathered once are dispersed again. Layer F is structured such that the dispersion of dislocation lines 14 is completed and the dislocation density distribution is uniformed and stabilized. In addition, when the dislocation lines 14 are once gathered in Layer D, part of them is eliminated while running into each other or while having a dislocation loop, and thereby the penetration thereof heading upward can be stopped. Therefore, in Layer F where the dislocations are dispersed again, the average dislocation density can be significantly reduced as compared to that in Layer C.

The upper and lower surfaces of the GaN self-standing substrate 16 thus obtained each are removed 10 μm and are mirror-finished by polishing to enhance the flatness thereof. The GaN self-standing substrate 16 has a final thickness of 230 μm and a strength sufficiently durable for handling by tweezers. By the TEM observation of cross section of GaN self-standing substrate 16, it is confirmed that the dislocation density distribution is sufficiently uniform near the surface (at least a region up to a 10 μm depth from the upper surface) of GaN self-standing substrate 16.

The dislocation density distribution at the surface of GaN self-standing substrate 16 is measured. The measurement method is such that the dislocation density of multiple points at intervals of 5 mm in the diameter direction of substrate is measured by counting the number of pits to be detected by etching using mixed acid of phosphoric acid and sulfuric acid being heated 240° C.

Figure 6:
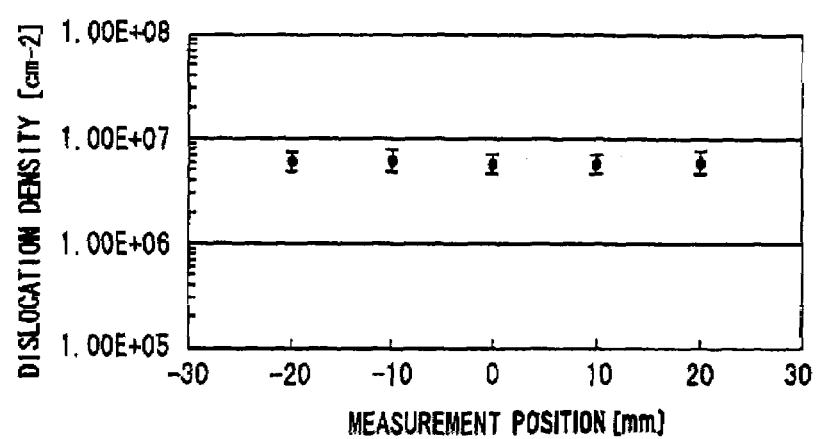
FIG. 6 is a graph showing the measurement results of dislocation density distribution at the upper surface of the resulting GaN self-standing substrate in the first embodiment.

FIG. 6 is a graph showing the measurement results of dislocation density distribution at the upper surface of the resulting GaN self-standing substrate in the first embodiment.

In FIG. 6, the horizontal axis represents a distance from a center point on a line to pass through the center of substrate, and one direction from the center point is defined to have a positive value and the other direction from the center point is defined to have a negative value. In the measurement results, it is confirmed that the dislocation density at the surface of GaN self-standing substrate 16 is in the range of $6.5\pm1.5\times10^6$ cm$^{-2}$ and is thus uniformed sufficiently.

Figure 7:
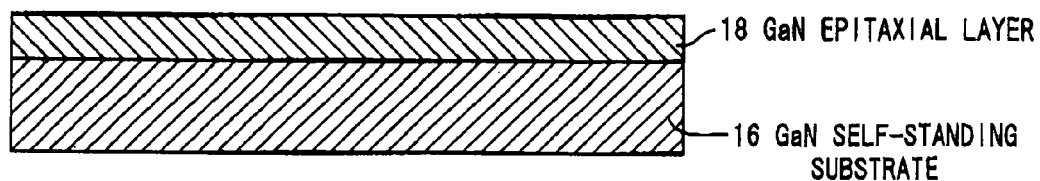
FIG. 7 is an illustrative cross sectional view showing the GaN self-standing substrate with a GaN epitaxial layer formed thereon in the first embodiment.

Further, as shown in FIG. 7, a GaN epitaxial layer 18 is 1 μm grown on the GaN self-standing substrate 16 by using MOVPE. In observing its surface morphology, it is confirmed that the entire surface of substrate is provided with a uniform mirror surface.

COMPARATIVE EXAMPLE 1

[Manufacturing of a GaN self-standing substrate that has a region with dislocation lines gathered densely and a region with dislocation lines thinly gathered]

Under the same conditions as the first embodiment except that the partial pressures of GaCl, NH$_3$ as source gas are set to be $5\times10^{-3}$ atm and 0.3 atm, respectively on the substrate region and the carrier gas is constantly mixed gas of 2% H$_2$ and 98% N$_2$ during the growth process, a GaN thick crystal film is grown on a sapphire substrate. As a result, until having a GaN thickness of 300 μm, a number of pits on the surface are left without being filled.

Then, the substrate is taken out from the reaction tube and, by removing the sapphire substrate by the aforementioned laser lift-off method, a GaN self-standing substrate is obtained. In order to enhance the flatness, the upper and lower surfaces of GaN self-standing substrate are mirror-polished 30 μm and 10 μm, respectively in depth. The pits left on the surface of substrate are almost eliminated by the mirror-polishing. The GaN self-standing substrate has a final thickness of 260 μm.

Then, the cross section of the GaN self-standing substrate is observed by TEM.

Figure 8:
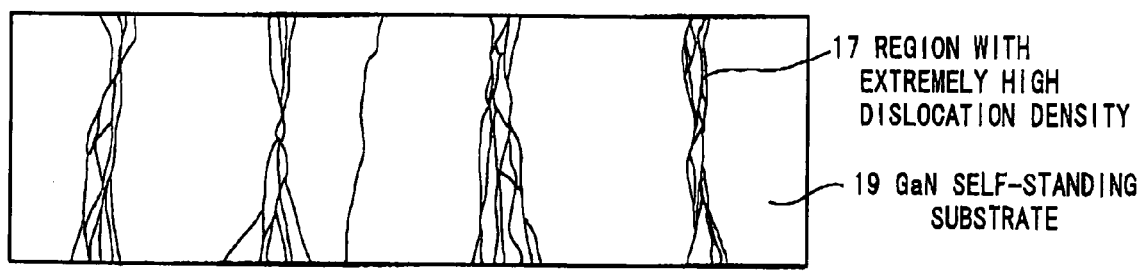
FIG. 8 is an illustrative cross sectional view showing a dislocation distribution of GaN self-standing substrate in comparative example 1.

FIG. 8 is an illustrative cross sectional view showing a dislocation distribution of GaN self-standing substrate in comparative example 1.

As shown in FIG. 8, it is observed that a number of regions 17 with extremely high dislocation density are generated formed columnar while interconnecting the upper and lower surfaces of GaN self-standing substrate 19. The regions 17 with extremely high dislocation density have a width of tens of μm and a distance of tens to hundreds of μm between the neighboring regions. In the GaN self-standing substrate 19, there is no region called a uniform dislocation density distribution on the surface of substrate.

The dislocation density distribution at the surface of GaN self-standing substrate 19 is measured. The measurement method is such that the dislocation density of multiple points at intervals of 5 mm in the diameter direction of substrate is measured by counting the number of pits to be detected by etching using mixed acid of phosphoric acid and sulfuric acid being heated 240° C.

Figure 9:
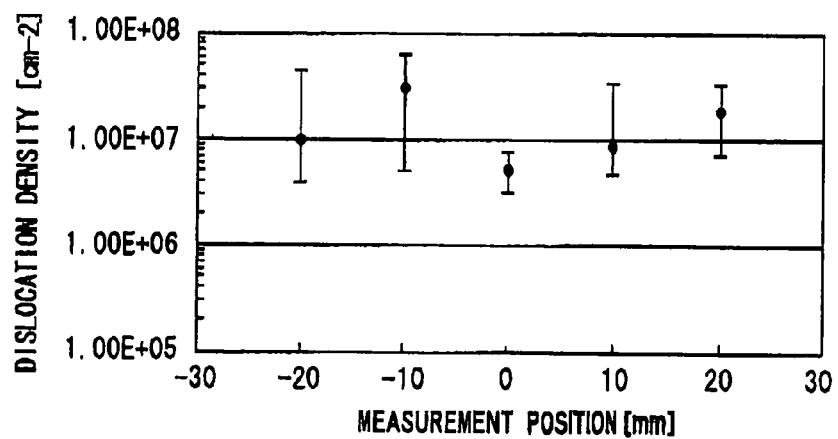
FIG. 9 is a graph showing the measurement results of dislocation density distribution at the upper surface of the resulting GaN self-standing substrate in comparative example 1.

FIG. 9 is a graph showing the measurement results of dislocation density distribution at the upper surface of the resulting GaN self-standing substrate in comparative example 1.

In FIG. 9, the horizontal axis represents a distance from a center point on a line to pass through the center of substrate, and one direction from the center point is defined to have a positive value and the other direction from the center point is defined to have a negative value. In the measurement results, the dislocation density at the surface of GaN self-standing substrate 19 is significantly fluctuated at all regions in the plane of substrate.

Further, a GaN epitaxial layer is 1 μm grown on the GaN self-standing substrate 19 by using MOVPE. In researching its surface morphology, it is confirmed that hexagonal uneven patterns of about 10 to 60 μm in diameter are generated on the epi-surface corresponding to the position of high dislocation density regions. It is assumed that the uneven patterns cause a failure in fabricating a device.

<Second Embodiment>

[Manufacturing of a GaN self-standing substrate that a layer with a substantially uniform dislocation density distribution is formed on a layer that has a region with dislocation lines gathered densely and a region with dislocation lines thinly gathered]

Under the same conditions as the first embodiment except that the crystal growth conditions by HVPE is slightly changed, a GaN epitaxial layer is grown on a sapphire substrate. Then, by removing the sapphire substrate, a GaN self-standing substrate is obtained and evaluated that, as shown in FIG. 3, layer B with a substantially uniform dislocation density distribution is formed on layer A that has a region with dislocation lines gathered densely and a region with dislocation lines thinly gathered.

Referring to FIGS. 4A to 4G, a method of making the GaN self-standing substrate in the second embodiment of the invention will be explained below.

First, using a sapphire C-face substrate 11 as shown in FIG. 4A, GaN crystal 12 is epitaxially grown by HVPE, like the first embodiment. The temperature of substrate region is set to be 1050° C. by using an electric oven. The partial pressures of GaCl, $NH_3$ as source gas are set to be $6 \times 10^{-3}$ atm and 0.4 atm, respectively on the substrate region. The carrier gas is mixed gas of 10% $H_2$ and 90% $N_2$ from the start. Further, during the growth process of GaN crystal, Si is doped supplying $SiH_2Cl_2$ as doping source gas to the substrate region.

Under these conditions, the crystal growth proceeds such that nuclei of GaN crystal 12 are grown like three-dimensional islands on the sapphire substrate 11 and then facets are generated on the sidewall of nucleus (Step B, FIG. 4B). This behavior is checked by conducting the microscopic observation of the surface and cross section of substrates taken out of the oven while changing the growth time.

As the growth time is increased, the top portion of GaN crystal 12 is flattened while laying (0001)Ga-face on the top. Then, the crystals are grown laterally and then coalesced to each other and, thus, the flattening of surface is advanced.

The crystal growth proceeds such that a number of dislocation lines 14 generated at the hetero-growth interface of the sapphire substrate 11 and the GaN crystal 12 have its propagation direction bent toward the bottom of pit 13 surrounded by the facets (Step C and Step D, FIGS. 4C and 4D).

Thereafter, as the crystal growth proceeds, a region with high dislocation density is formed due to the collecting of dislocation lines 14, and when the crystal growth is continued under the same conditions, the pits 13 on the growth interface of GaN crystal 12 are terminated by itself and the growth interface is flattened (Step E, FIG. 4E).

After the growth interface of GaN crystal 12 is flattened, the GaN crystal 12 is further grown to have a thickness of 100 μm or more. Finally, the GaN crystal 12 with a total thickness of 550 μm is grown on the sapphire substrate 11 (Step F, FIG. 4F). In Step F, the dislocation lines 14 are dispersed again that were once gathered having the region 15 with high dislocation density. Thereby, a stabilized layer with uniform dislocation density distribution is formed. Meanwhile, the GaN crystal 12 is grown at an average growth rate of about 65 μm/h.

Then, the substrate is taken out from the reaction tube and, by removing the sapphire substrate 11 by the aforementioned laser lift-off, a GaN self-standing substrate 16 is obtained (Step G, FIG. 4G). In order to enhance the flatness, the upper and lower surfaces of GaN self-standing substrate are mirror-polished 30 μm and 90 μm, respectively in depth. By the mirror-polishing, the GaN self-standing substrate 16 has a final thickness of 430 μm.

The dislocation density distribution at the surface of GaN self-standing substrate 16 is measured such that, by cathodoluminescence observation, the dislocation density of multiple points is measured at intervals of 5 mm in a diameter direction of substrate. As a result, it is confirmed that the dislocation density at the surface of substrate is in the range of $3.8 \times 10^6$ $cm^{-2}$ to $7.9 \times 10^6$ $cm^{-2}$ and is thus uniformed sufficiently.

Further, in measuring the dislocation density at the lower (back) surface of GaN self-standing substrate 16 by cathodoluminescence, it is confirmed that the dislocation density is in the range of $2.1 \times 10^7$ $cm^{-2}$ to $4.9 \times 10^8$ $cm^{-2}$ and is thus higher than that of the upper surface. On the lower surface of substrate, some regions with dislocations gathered densely are observed in places.

In observing the cross section of GaN self-standing substrate 16 by TEM, it is confirmed that, up to a depth of 100 μm or more from the surface of substrate, there is no layer that has a region with dislocation lines gathered densely and a region with dislocation lines thinly gathered.

<Third Embodiment>

[Manufacturing by VAS of a GaN self-standing substrate that a layer with a substantially uniform dislocation density distribution is formed on a layer that has a region with dislocation lines gathered densely and a region with dislocation lines thinly gathered]

By using the VAS (void-assisted separation) method, a GaN epitaxial layer is grown on a sapphire substrate. Then, by removing the sapphire substrate, a GaN self-standing substrate is obtained and evaluated that a layer with a substantially uniform dislocation density distribution is formed on a layer that has a region with dislocation lines gathered densely and a region with dislocation lines thinly gathered. The VAS method is such a method that the crystal growth is conducted while sandwiching a titanium nitride thin film with a network structure between a sapphire substrate and a GaN growth layer, and is disclosed in Japanese patent application laid-open No. 2003-178984.

Referring to FIGS. 10A to 10G, a method of making the GaN self-standing substrate in the third embodiment of the invention will be explained below.

Figure 10A:
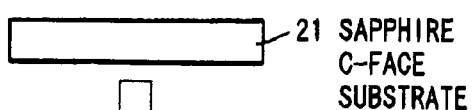
FIGS. 10A to 10J are cross sectional views showing a method of making the GaN self-standing substrate in a third preferred embodiment according to the invention.
Figure 10B:

First, an undoped GaN layer 22 is 300 nm thick grown on a single-crystal sapphire C-face substrate 21 with a diameter of 2 inches as shown in FIG. 10A using trimethylgallium (TMG) and NH$_3$ as source gases by MOVPE (Step B, FIG. 10B).

Figure 10C:
Figure 10D:
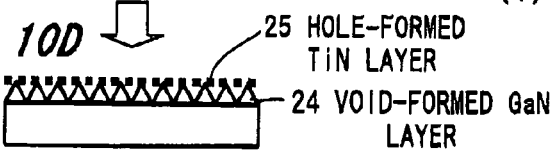
Figure 10E:
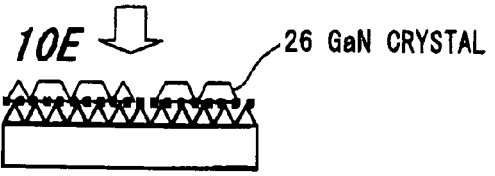
Figure 10F:
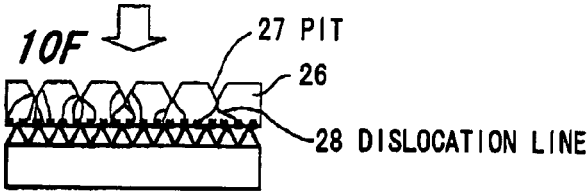
Figure 10G:
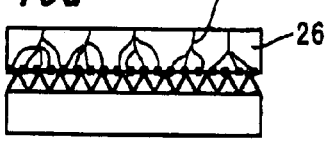

Then, 20 nm thick Ti thin film 23 is deposited on the GaN layer 22 (Step C, FIG. 10C).

Then, the substrate 21 with the GaN layer 22 and thin film 23 is entered into an electric oven, and is thermally treated in mixed gas flow of 20% NH$_3$ and 80% H$_2$ at 1050° C. for 20 min. As a result, part of the undoped GaN layer 22 is etched to generate voids with high density and, thereby, is changed into a void-formed GaN layer 24. Simultaneously, the Ti thin film 23 is nitrided and, thereby, is changed into a hole-formed TiN layer 25 with microscopic submicron holes densely formed thereon (Step D, FIG. 10D).

Then, the substrate is entered into a HVPE oven to grow GaN crystal 26 with a total thickness of 400 m. Source gases used to grow the GaN crystal 26 are NH$_3$ and GaCl and carrier gas is mixed gas of 5% H$_2$ and 95% N$_2$. The growth conditions are atmospheric pressure and a substrate temperature of 1040° C. The partial pressures of GaCl, NH$_3$ as source gas are at the start of growth $8\times10^{-3}$ atm and $5.6\times10^2$ atm, respectively and the V/III ratio is seven. Further, during the growth process of GaN crystal 26, Si is doped supplying SiH$_2$Cl$_2$ as doping source gas to the substrate region.

Under these conditions, nuclei of GaN are first grown like three-dimensional islands on the TiN layer 25 (Step E, FIG. 1E) and then crystals are grown laterally and then coalesced to each other and, thus, the flattening of surface is advanced. This behavior is checked by conducting the microscopic observation of the surface and cross section of substrates taken out of the oven while changing the growth time.

As the growth time is increased, pits 27 on the growth interface of GaN crystal 26 decreases but they are not perfectly eliminated. The crystal growth proceeds such that, while a number of pits 27 are still left on the surface, a number of dislocation lines 28 generated at the heterogrowth interface of the sapphire substrate 21 and the GaN crystal 26 have its propagation direction bent toward the bottom of pit 27 surrounded by facets (Step F, FIG. 10F). The pit 27 is, viewing from directly above, around circular or dodecagonal has a diameter of several gm to several tens of μm. In observing the cross section of a sample in Step F by TEM, a region is confirmed that penetration dislocations are gathered from the interface of TiN layer 25 toward the bottom of pit 27 existing on the surface of GaN.

Figure 10H:
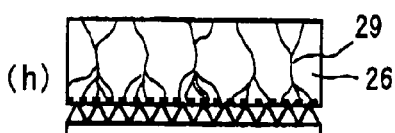

As the GaN crystal 26 is further grown, a region 29 with high dislocation density is formed due to the collecting of dislocation lines 28. Then, when the crystal growth is continued by increasing only the partial pressure of GaCl in the source gas to $12\times10^{-2}$ atm, the pits 27 are terminated and the growth interface of GaN crystal 26 is further flattened (Step G, FIG. 10G). After the growth interface of GaN crystal 26 is thus flattened, the GaN crystal 26 is continuously grown to have a thickness of 200 μm or more. It is confirmed by TEM observation in cross section that, in the region grown after the flattening of growth interface, the dislocations once gathered to form the region 29 with high dislocation density are dispersed again and propagated (Step H, FIG. 10H) to be almost uniformly dispersed in process of the growth of GaN crystal 26, and that the region 29 with high dislocation density does not reach the uppermost surface of GaN crystal 26.

Figure 10I:
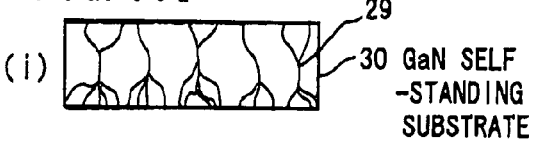

In process of cooling the HVPE apparatus after ending the growth of GaN crystal 26, the GaN layer 26 is by itself separated from the sapphire underlying substrate while bordering at the void-formed layer 24 and the GaN self-standing substrate 30 is thus obtained (Step I, FIG. 10I).

Figure 10J:
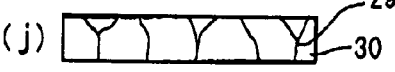

In order to enhance the flatness, the upper and lower surfaces of GaN self-standing substrate 30 are mirror-polished 20 μm and 50 μm , respectively in depth. By the mirror-polishing, the GaN self-standing substrate 30 has a final thickness of 330 μm (Step J, FIG. 10J).

The dislocation density distribution at the surface of GaN self-standing substrate 30 thus obtained is measured, like the measurement method of the first embodiment, at intervals of 5 mm in a diameter direction of substrate.

Figure 11:
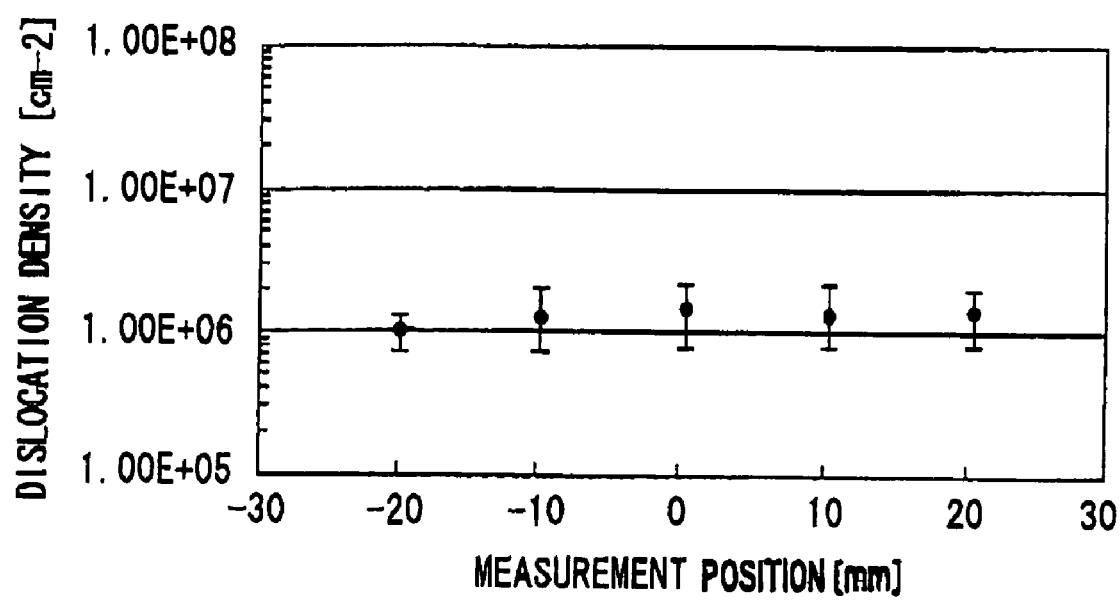
FIG. 11 is a graph showing the measurement results of dislocation density distribution at the upper surface of the resulting GaN self-standing substrate in the third embodiment.

FIG. 11 is a graph showing the measurement results of dislocation density distribution at the upper surface of the resulting GaN self-standing substrate in the third embodiment. In FIG. 11, the horizontal axis represents a distance from a center point on a line to pass through the center of substrate, and one direction from the center point is defined to have a positive value and the other direction from the center point is defined to have a negative value. In the measurement results, it is confirmed that the dislocation density at the surface of GaN self-standing substrate 30 is in the range of $1.4\pm0.7\times10^6$ cm$^{-2}$ and is thus uniformed sufficiently.

<Fourth Embodiment>

[Manufacturing by FIELO of a GaN self-standing substrate that a layer with a substantially uniform dislocation density distribution is formed on a layer that has a region with dislocation lines gathered densely and a region with dislocation lines thinly gathered]

By using the FIELO method, a GaN epitaxial layer is grown on a sapphire substrate. Then, by removing the sapphire substrate, a GaN self-standing substrate is obtained and evaluated that a layer with a substantially uniform dislocation density distribution is formed on a layer that has a region with dislocation lines gathered densely and a region with dislocation lines thinly gathered.

Referring to FIGS. 12A to 12I, a method of making the GaN self-standing substrate in the fourth embodiment of the invention will be explained below.

First, an undoped GaN layer 32 is 600 nm thick grown on a single-crystal sapphire C-face substrate 21 with a diameter of 2 inches as shown in FIG. 12A using trimethylgallium (TMG) and $NH_3$ as source gases by MOVPE (Step B, FIG. 12B).

Then, 0.5 μm thick $SiO_2$ mask 33 is deposited on the GaN layer 32 by thermal CVD. By making stripe windows in parallel to <11–20> in the $SiO_2$ mask 33 by photolithography, the undoped GaN layer 32 is exposed therethrough (Step C, FIG. 10C). The windows have a width of 3 μm and the $SiO_2$ mask 33 has a width of 7 μm.

Then, the substrate 31 with the GaN layer 32 and $SiO_2$ mask 33 is entered into a HVPE oven to grow GaN crystal 34 with a total thickness of 500 μm. Source gases used to grow the GaN crystal 34 are $NH_3$ and GaCl and carrier gas is mixed gas of 5% $H_2$ and 95% $N_2$. The growth conditions are atmospheric pressure and a substrate temperature of 1040° C. The partial pressures of GaCl, $NH_3$ as source gas are at the start of growth $8\times10^{-3}$ atm and $5.6\times10^{-2}$ atm, respectively and the V/III ratio is seven. Further, during the growth process of GaN crystal 34, Si is doped supplying $SiH_2Cl_2$ as doping source gas to the substrate region.

The GaN crystal 34 is at first selectively grown on the underlying GaN to be arranged in stripe and in parallel to <11–20>. A cross section perpendicular to <11–20> is as schematically shown in FIG. 12D.

After the groove (exposed part) of mask 33 is filled with GaN, the GaN crystal 34 is laterally grown on the $SiO_2$ mask 33 to cover the entire surface of substrate. At this stage, facets are generated on the side of the GaN crystal 34 being grown in stripe and thereby V-shaped grooves 35 in cross section are generated at a region where neighboring GaN crystals are coalesced (Step E, FIG. 12E). This behavior is checked by conducting the microscopic observation of the surface and cross section of substrates taken out of the oven while changing the growth time.

In observing the cross section of a sample in Step E by TEM, it is confirmed that a number of dislocations generated near at the interface of the GaN crystal 34 and the $SiO_2$ mask 33 are gathered toward the bottom of the V-shaped groove 35 existing on the surface of GaN crystal 34.

As the crystal growth time is increased, the crystal growth proceeds while leaving the V-shaped grooves 35 on the growth interface. However, the grooves 35 are gradually filled with the progress of growth, and when the thickness of GaN crystal 34 exceeds 100 μm, the growth interface of GaN crystal 34 is flattened (Step F, FIG. 12F).

After the growth interface of GaN crystal 34 is flattened, the GaN crystal 34 is continuously grown until it has a thickness of about 400 μm. In observing the cross section of the resulting GaN crystal by TEM, it is confirmed that in the GaN crystal grown up to Step F a region 36 with high dislocation density due to the dislocations densely gathered is observed, and in the GaN crystal grown after Step F the dislocations once gathered are uniformly dispersed again and propagated with the progress of crystal growth. Thus, it is confirmed that the region 36 with high dislocation density is eliminated in process of the growth of GaN crystal 34 (Step G, FIG. 12G) and it does not reach the uppermost surface of crystal.

Thus, the GaN crystal 34 is obtained with a total thickness of about 500 μm. Meanwhile, the GaN crystal 34 is grown at an average growth rate of about 75 μm/h.

Then, the substrate is taken out from the reaction tube and, by removing the sapphire substrate 31 by the aforementioned laser lift-off, a GaN self-standing substrate 37 is obtained (Step H, FIG. 4H).

In order to enhance the flatness, the upper and lower surfaces of GaN self-standing substrate 37 are mirror-polished 20 μm and 80 μm, respectively in depth (Step I, FIG. 12I). By the mirror-polishing, the GaN self-standing substrate 37 has a final thickness of 400 μm.

The dislocation density distribution at the upper and lower surfaces of GaN self-standing substrate 37 is measured such that, like the measurement method of the first embodiment, the dislocation density of multiple points is measured at intervals of 5 mm in a diameter direction of substrate. As a result, it is confirmed that the dislocation density at the surface of substrate is in the range of $7.2\pm2.0\times10^6$ cm$^{-2}$ in the entire plane of substrate and is thus uniformed sufficiently.

Further, a GaN epitaxial layer is 1 μm thick grown on the GaN self-standing substrate 37 by MOVPE. In observing the surface morphology, it is confirmed that the entire surface of substrate is provided with a uniform mirror surface.

<Fifth Embodiment>

[Forming of GaN crystal on the GaN-self-standing substrate]

Using the GaN self-standing substrate 30 obtained in the third embodiment (Step I in FIG. 10I) as an underlying substrate, GaN crystal is 20 mm thick grown thereon by HVPE. The growth conditions in HVPE are the same as those in the first embodiment.

The 20 mm thick GaN crystal layer thus grown is attached to a fixing tool and is cut by using a wire saw with a diamond powder electrodeposited thereon. The GaN crystal is cut perpendicular to the growth direction of crystal (i.e., in parallel to the surface of underlying substrate). Thus, from the thick grown GaN layer, 19 GaN substrates with a diameter of 50 mm and a thickness of 450 μm are cut out. By mirror-polishing the upper and lower surfaces of GaN substrates thus cut out, colorless and transparent GaN self-standing substrates are obtained.

In observing an arbitrary surface and cross section of each of the GaN self-standing substrates thus obtained by TEM, it is confirmed that there is no layer that has a region with dislocation lines gathered densely and a region with dislocation lines thinly gathered. This is because the crystal growth is conducted twice so as not to have the region 29 with high dislocation density due to the dislocations densely gathered.

Further, a GaN epitaxial layer is 2 μm thick grown on each of the GaN self-standing substrates by MOVPE. In observing the surface morphology, it is confirmed that the entire surface of substrate is provided with a uniform mirror surface.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

For example, in the above embodiments, the MOVPE method may be incorporated to part of GaN crystal growth process. Further, at the initial stage or intermediate stage of crystal growth, the conventional ELO technique using a mask such as $SiO_2$ may be incorporated in order to conduct the growth while generating concaves on the crystal growth interface.

Although in the above embodiments the sapphire substrate is used as the underlying substrate, all conventionally known substrates, such as GaAs, Si, $ZrB_2$ and ZnO, to be used as a GaN system epitaxial layer forming substrate can be applied thereto.

Although in the above embodiments the method of making a GaN self-standing substrate doped with Si is exemplified, the invention can be applied to a GaN self-standing substrate undoped or doped with another dopant such as Mg, Fe, S, O, Zn, Ni, Cr and Se.

Although in the above embodiments the method of making a GaN self-standing substrate is exemplified, the invention can be applied to an AlGaN self-standing substrate.

In a modification of the invention, when a III–V group nitride system semiconductor substrate of the invention is used as seed crystal in growing a bulk crystal of III–V group nitride system semiconductor, a III–V group nitride system semiconductor substrate with low dislocation density can be easily obtained.

What is claimed is:

1. A III–V group nitride system semiconductor self-standing substrate, comprising:

III–V group nitride system semiconductor crystal, wherein the substrate has a dislocation density distribution that is substantially uniform at least at a surface of the substrate and the substrate has an average dislocation density of $5 \times 10^7$ $cm^{-2}$ or less at an arbitrary cross section that is in parallel to the surface of the substrate, the dislocation density being located up to 10 µm from an upper surface of the substrate, and the number of dislocation lines intersecting a unit area of 400 µm² at an arbitrary position on the cross section is less than 400.

* * * * *